United States Patent
Lee et al.

(10) Patent No.: US 11,038,036 B2
(45) Date of Patent: Jun. 15, 2021

(54) SEPARATE EPITAXY LAYERS FOR NANOWIRE STACK GAA DEVICE

(71) Applicant: Taiwan Semiconductor Manufacturing Co., Ltd., Hsinchu (TW)

(72) Inventors: Tung Ying Lee, Hsinchu (TW); Kai-Tai Chang, Kaohsiung (TW); Meng-Hsuan Hsiao, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/536,113

(22) Filed: Aug. 8, 2019

(65) Prior Publication Data

US 2020/0098879 A1    Mar. 26, 2020

Related U.S. Application Data

(60) Provisional application No. 62/736,962, filed on Sep. 26, 2018.

(51) Int. Cl.
| | |
|---|---|
| *H01L 29/423* | (2006.01) |
| *H01L 21/8234* | (2006.01) |
| *H01L 29/66* | (2006.01) |
| *H01L 21/02* | (2006.01) |
| *H01L 21/8238* | (2006.01) |

(52) U.S. Cl.
CPC .. *H01L 29/42392* (2013.01); *H01L 21/02433* (2013.01); *H01L 21/823431* (2013.01); *H01L 21/823864* (2013.01); *H01L 29/66287* (2013.01); *H01L 29/66553* (2013.01)

(58) Field of Classification Search
CPC ......... H01L 29/42392; H01L 29/78696; H01L 21/02507
See application file for complete search history.

(56) References Cited

U.S. PATENT DOCUMENTS

| | | |
|---|---|---|
| 9,236,267 B2 | 1/2016 | De et al. |
| 9,502,265 B1 | 11/2016 | Jiang et al. |
| 9,520,466 B2 | 12/2016 | Holland et al. |
| 9,520,482 B1 | 12/2016 | Chang et al. |
| 9,536,738 B2 | 1/2017 | Huang et al. |

(Continued)

FOREIGN PATENT DOCUMENTS

| | | |
|---|---|---|
| KR | 101669375 B1 | 10/2016 |
| KR | 20170036966 A | 4/2017 |

(Continued)

*Primary Examiner* — Jay C Chang
*Assistant Examiner* — Mikka Liu
(74) *Attorney, Agent, or Firm* — Slater Matsil, LLP

(57) ABSTRACT

The current disclosure describes techniques for forming gate-all-around ("GAA") devices from stacks of separately formed nanowire semiconductor strips. The separately formed nanowire semiconductor strips are tailored for the respective GAA devices. A trench is formed in a first stack of epitaxy layers to define a space for forming a second stack of epitaxy layers. The trench bottom is modified to have determined or known parameters in the shapes or crystalline facet orientations. The known parameters of the trench bottom are used to select suitable processes to fill the trench bottom with a relatively flat base surface.

20 Claims, 12 Drawing Sheets

(56) References Cited

U.S. PATENT DOCUMENTS

| | | |
|---|---|---|
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |
| 2006/0240622 A1 | 10/2006 | Lee et al. |
| 2016/0163810 A1* | 6/2016 | Huang .............. H01L 29/42356 257/329 |
| 2017/0092547 A1 | 3/2017 | Tang et al. |
| 2017/0179248 A1 | 6/2017 | Pawlak |
| 2018/0114727 A1 | 4/2018 | Rodder et al. |

FOREIGN PATENT DOCUMENTS

| | | |
|---|---|---|
| KR | 20180044794 A | 5/2018 |
| TW | 201409716 A | 3/2014 |
| TW | 201611287 A | 3/2016 |
| TW | 201626463 A | 7/2016 |
| TW | 201735160 A | 10/2017 |
| WO | 2014051762 A1 | 4/2014 |
| WO | 2015195134 A1 | 12/2015 |

\* cited by examiner

SEPARATE EPITAXY LAYERS FOR NANOWIRE STACK GAA DEVICE

BACKGROUND

Complementary metal oxide semiconductor (CMOS) transistors are building blocks for integrated circuits. Faster CMOS switching speed requires higher drive current, which drives the gate lengths of CMOS transistors being continuously scaled down. Shorter gate length leads to undesirable "short-channel effects," in which the current control function of the gates are compromised. FinFET transistors have been developed to, among others, overcome the short-channel effects. As a further step toward improving the electrostatic control of the channels, transistors having wrapped-around gates have been developed, in which a gate portion may surround a semiconductor channel or a channel strip from the upper surface, lower surface and/or sidewalls thereof.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Figure 1:
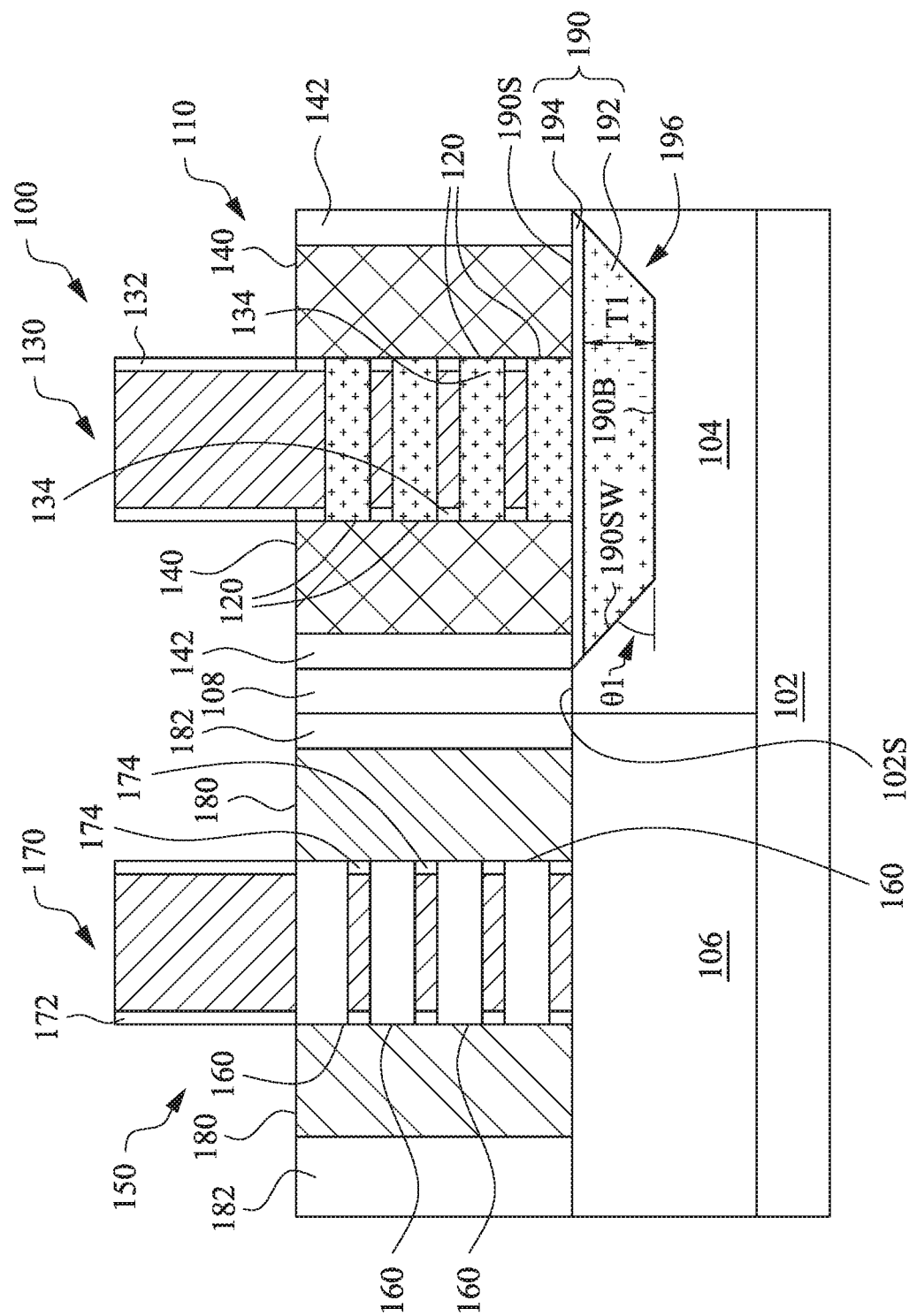
FIG. 1 is a cross-sectional view of an example integrated circuit (IC)

The current disclosure describes techniques for forming gate-all-around ("GAA") devices from stacks of separately formed nanowire semiconductor strips. In the description herein, a "nanowire strip" or "nanowire" refers to a strip-shaped structure that has an edge surface dimension ranging from about 2 nm to about 50 nm. A "nanowire strip" may refer to a strip-shaped structure that has an edge surface diameter ranging from about 2 nm to about 15 nm. A "nanosheeo strip" may refer to a strip-shaped structure that have an edge surface having a height ranging from about 2 nm to about 10 nm and a width ranging from about 6 nm to about 50 nm. Other dimensional parameters of the nanowire semiconductor strips are also possible. In the description herein, the terms "nanowire" or "nanowire strip" or "strip" are used to refer to any type of strip-shaped structures including, but not limited to, nanowire, nanosheet or nanoslab.

The separately formed nanowire semiconductor strips are tailored for the respective GAA devices. For example, the size, the material composition, and the positioning of strips are separately designed for nFET and pFET devices. Between the nFET and pFET devices, at least one of the two types of devices are made from locally formed nanowire strips within a define space. The inventors have observed that in the growth of epitaxy layers within a defined space, like in a trench, the profiles of the deposited epitaxy layers are affected by the shaped of the bottom surface of the defined space and the sidewall portions adjacent to the bottom surface. Specifically, the crystalline facets of the sidewall portions adjacent to the bottom surface affect the growth of the epitaxy layers by the sidewalls. In actual production, the shapes of trench bottoms may be affected by many factors intentionally or unintentionally.

The current techniques include processes to intentionally modify or create a trench bottom portion to have determined or known parameters in the shapes or crystalline facet orientations. With such parameters determined, the subsequent fabrication processes are conducted accordingly.

For example, a crystallographic anisotropic wet etching is conducted to form a recess portion in a bottom of a trench. The depth of the recess portion and the slope angle of the sidewall of the recess portion are determined according to the anisotropic etching. With such parameters given, a silicon germanium epitaxy layer is formed in the recess portion to fill the recess portion. The silicon germanium epitaxy growth is controlled such that the silicon germanium material grows much faster along the facet orientation of the bottom plane of the recess portion, e.g., of {100} facet silicon, than along a facet orientation of the sidewall of the recess portion, e.g., of {111} facet of silicon. For example, the silicon germanium epitaxy process may be designed to facilitate silicon germanium grown in the {100} facet instead of the {111} facet. Due to the lattice mismatch, the {100} facet silicon germanium does not stay on the sidewall of the recess portion of {111} facet silicon. With the silicon germanium epitaxy layer grow substantially along the {100} facet in stead of the {111} face thereof, the silicon germanium epitaxy layer is substantially flat with respect to the bottom of the recess portion, e.g., of {100} facet silicon. With a base silicon germanium epitaxy layer being substantially flat, the epitaxy layers of silicon and silicon germanium deposited over the base silicon germanium epitaxy layer also tend to be flat.

In a method embodiment, a first stack of epitaxy silicon layers and epitaxy silicon germanium layers are formed over a substrate, e.g., a silicon substrate. The epitaxy silicon germanium layers and the epitaxy silicon layers are stacked vertically in an alternating manner. A silicon germanium layer in the first stack has a first thickness and a first germanium concentration, e.g., an atomic ratio of germanium among total silicon and germanium. A silicon layer in the first stack has a second thickness that may be different than the first thickness of the silicon germanium in the first stack. In an embodiment, the silicon layers and the silicon germanium layers in the first stack are formed using epitaxy processes and are referred to as epitaxy layers.

A trench is formed at least partially in the first stack of epitaxy layers, which exposes the silicon substrate. Optionally, a device spacer of dielectric material is formed by the sidewall of the trench. After the formation of the trench or after the formation of the device spacer, a bottom surface of the trench may include a recess in the silicon substrate. Normally, the recess includes a first portion which is a relatively flat bottom of the recess. A second portion of the recess is a sloped sidewall portion adjacent to the flat bottom. The actual shapes or parameters of the recess may vary among wafers.

A crystallographic anisotropic etching is conducted to modify the shape of the recess portion. Specifically, the modification is achieved through the crystallographic anisotropic etching process has different etching rates among different crystalline facets/planes of the substrate. For example, the crystallographic anisotropic etch process is controlled to have higher etch rates on the {110} {100} facets than on the {111} facets. Resultantly, the sidewall of the recess portion is modified to be substantially at the {111} facet of the silicon substrate. For the silicon, the {111} facet has an angle of about 54.7 degree with respect to the {100} plane. After the modification, the sidewall of the recess portion has an angle of about 54.7 degree with respect to the bottom portion. Other angles of the sidewall are also possible as long as the angles are known and controlled. For example, the angle of the sidewall may be formed within a range of about 45 degree to about 65 degree to be generally in line with the angle between the {111} facet plane and the {100} plane of silicon.

After the recess portion is modified, a base layer of silicon germanium is formed in the recess portion through an epitaxy process. Silicon germanium has a good gap filling property such that the minor unevenness on the bottom of the recess may be filled by the silicon germanium base layer. Further, the epitaxy conditions may be selected and controlled such that the silicon germanium material does not form on the {111} facet, e.g., due to lattice mismatch. As a result, the silicon germanium base layer is substantially facet-free at the edge portions and is relatively flat. Depending on the stack of epitaxy layers to be formed within the trench, an epitaxy base layer of silicon may be formed over the silicon germanium base layer. Given that the surface of the silicon germanium base layer is relatively flat, the surface of the silicon base layer is also relatively flat. The top surface of the silicon base layer is substantially at a same level as the silicon substrate. The silicon germanium and silicon base layers are used to fill the recess and to generate a flat surface for subsequent deposition of epitaxy layers within the trench. They are not used to form a semiconductor body, e.g., a channel of a device.

A second stack of silicon epitaxy layers and silicon germanium epitaxy layers are formed in the trench over the base layers. In an embodiment, a silicon germanium epitaxy layer in the second stack includes a third thickness and a second germanium concentration. A silicon epitaxy layer in the second stack includes a fourth thickness. In an embodiment, the third thickness of the silicon germanium layer in the second stack is different from the first thickness of the silicon germanium layer in the first stack. The fourth thickness of the silicon layer in the second stack is different from the second thickness of the silicon layer in the first stack. Further, the second germanium concentration of the silicon germanium layer in the second stack is different from the first germanium concentration of the silicon germanium layer in the first stack.

The first stack of epitaxy layers and the second stack of epitaxy layers are patterned to define a first fin region and a second fin region for a first device and a second device. The first device is formed over the first fin region. The second device is formed over the second fin region. The silicon germanium base layer and the silicon base layer may also be patterned below the second fin region. The silicon germanium base layer has an inverted tapered sidewall that has an angle of about 54.7 degree with a bottom surface of the silicon germanium layer.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIG. 1 is a cross-sectional view of an example integrated circuit structure "IC" 100 including a CMOS component. Referring to FIG. 1, the IC 100 includes a substrate 102. Optionally, the substrate 102 includes an n-doped region "n-well" 104 and a p-doped region "p-well" 106. A first device 110, e.g., a pFET, is formed over and/or within the n-well 104. A second device 150, e.g., an nFET, is formed over and/or within the p-well 106. One or more dielectric body 108 (also referred to as device spacer 108) is positioned to separate the first device 110 and the second device 150 from one another. It should be appreciated that depending on device designs or configurations, the n-well 104 or the p-well 106 may not be needed for the substrate 102. In the description herein, the n-well 104 and the p-well 106 are used for illustration and are referred to as substrate region 104 and substrate region 106 for purposes of generalization.

The first device 110 and the second device 150 each includes a vertical stack of a plurality of (four shown for each for illustration purposes only) discrete semiconductor nanowire strips 120, 160, respectively. In an embodiment, the nanowire strips 120 are silicon germanium and the nanowire strips 160 are silicon. The first device 110 and the second device 150 each includes a gate structure 130, 170 that surrounds, e.g., wraps around, at least some of the respective discrete nanowire strips 120, 160. The discrete nanowire strips 120, 160 are configured as channel regions of the devices 110, 150 and form junctions with respective source/drain regions 140, 180. The source/drain regions 140, 180 are separated from the respective gates 130, 170 by inner spacers 134, 174 and/or outer spacers 132, 172.

In an embodiment, the device 110 is configured as a pFET and the device 150 is configured as an nFET. The nanowire strips 120 are silicon germanium or other suitable semiconductor materials. The source/drain region 140 is silicon germanium ("SiGe") or silicon-germanium-boron ("SiGeB"), or other suitable semiconductor materials for P-type devices. The source/drain region 180 is silicon-carbon-phosphide ("SiCP"), silicon carbide ("SiC"), or silicon phosphide ("SiP"), or other suitable semiconductor materials for N-type devices. The source/drain regions 140, 180 may each be doped in various ways. For example the source/drain region 140 are doped with boron, gallium, indium and other suitable dopants in group III. The source/drain regions 180 are doped with arsenic, phosphorus and other suitable dopants in group V.

FIG. 1 shows example embodiments of the source/drain structures 140, 180. In the embodiment shown, the source/drain structure 140, 180 each contacts the respective nanowire strips 120, 160 by the edge surfaces of the nanowire strips 120, 160. Further, the source/drain structure 140, 180 are each adjacent to a respective dielectric layer 142, 182. The dielectric layers 142, 182 may be a same layer or may be two different layers. The dielectric layers 142, 182 may include the same dielectric material as the device spacer 108 or may include different dielectric materials from that of the device spacer 108. The dielectric layers 142, 182 may be silicon oxide, silicon nitride, a low-k dielectric material or other suitable dielectric materials.

FIG. 1 shows, as an illustrative example, an example structural configuration between the source/drain regions 140, 180 and the channel regions 120, 160. Specifically, the source/drain region 140, 180 each contacts the edge surfaces of the respective channels 120, 160. This example embodiment does not limit the scope of the disclosure and other embodiments. Other structural configurations of the source/drain structure 140/180 and the semiconductor nanowire strips 120/160 are also possible and included in the disclosure. For example, the source/drain structures 140/180 may wrap around at least some of the respective semiconductor nanowire strips 120/160. The nanowire strips 120, 160 may be receded (as shown in FIG. 1) or may extend all the way between the respective dielectric layers 142, 182.

The substrate 102 may include a silicon substrate in crystalline structure and/or other elementary semiconductors like germanium. Alternatively or additionally, the substrate 102 may include a compound semiconductor such as silicon carbide, gallium arsenide, indium arsenide, and/or indium phosphide. Further, the substrate 102 may also include a silicon-on-insulator (SOI) structure. The substrate 102 may include an epitaxial layer and/or may be strained for performance enhancement.

In an embodiment, the substrate 102 include a facet region of the {100} facet of silicon.

In an embodiment, the gate structures 130, 170 are each formed as a replacement metal gate. The following description lists examples of materials for the gate structure 130, 170. The gate electrodes of the gates 130, 170 (not separately shown for simplicity) each include a conductive material, e.g., a metal or a metal compound. Suitable metal materials for the gate electrode of the gate structures 130, 170 include ruthenium, palladium, platinum, tungsten, cobalt, nickel, and/or conductive metal oxides and other suitable P-type metal materials and include hafnium (Hf), zirconium (Zr), titanium (Ti), tantalum (Ta), aluminum (Al), aluminides and/or conductive metal carbides (e.g., hafnium carbide, zirconium carbide, titanium carbide, and aluminum carbide), and other suitable materials for n-type metal materials. In some examples, the gate electrodes of the gate structures 130, 170 each include a work function layer tuned to have a proper work function for enhanced performance of the field effect transistor devices. For example, suitable n-type work function metals include Ta, TiAl, TiAlN, TaCN, other n-type work function metal, or a combination thereof, and suitable p-type work function metal materials include TiN, TaN, other p-type work function metal, or combination thereof. In some examples, a conductive layer, such as an aluminum layer, a copper layer, a cobalt layer or a tungsten layer is formed over the work function layer such that the gate electrodes of gate structures 130, 170 each includes a work function layer disposed over the gate dielectric and a conductive layer disposed over the work function layer and below a gate cap (not shown for simplicity). In an example, the gate electrodes of the gate structures 130, 170 each have a thickness ranging from about 5 nm to about 40 nm depending on design requirements.

In example embodiments, the gate dielectric layer (not separately shown for simplicity) of the gate structures 130, 170 includes an interfacial silicon oxide layer (not separately shown for simplicity), e.g., thermal or chemical oxide having a thickness ranging from about 5 to about 10 angstrom (Å). In example embodiments, the gate dielectric layer further includes a high dielectric constant (high-k) dielectric material selected from one or more of hafnium oxide ($HfO_2$), hafnium silicon oxide (HfSiO), hafnium silicon oxynitride (HfSiON), hafnium tantalum oxide (HMO), hafnium titanium oxide (HMO), hafnium zirconium oxide (HfZrO), combinations thereof, and/or other suitable materials. A high-k dielectric material, in some applications, includes a dielectric constant (k) value larger than 6. Depending on design requirements, a dielectric material of a dielectric contact (k) value of 7 or higher is used. The high-K dielectric layer may be formed by atomic layer deposition (ALD) or other suitable technique. In accordance with embodiments described herein, the high-k dielectric layer of the gate dielectric layer includes a thickness ranging from about 10 to about 30 angstrom (Å) or other suitable thickness.

In an embodiment, the outer spacers 132, 172 is formed of a low-k dielectric material, e.g., k value lower than 3.9, such as silicon oxynitride (SiON), silicon monoxide (SiO), silicon oxynitrocarbide (SiONC), silicon oxycarbide (SiOC), vacuum, and other dielectrics or other suitable materials. The outer spacer 132, 172 may be formed through chemical vapor deposition (CVD), high density plasma CVD, spin-on, sputtering, or other suitable approaches.

In an embodiment, the inner spacers 134, 174 are formed of a low-K dielectric material. In some embodiments, the low-k dielectric material of the inner spacers 134, 174 may have a different dielectric constant than that of the respective outer spacer 132, 172. The low-k material for the inner spacer 134, 174 includes one or more of silicon oxynitride (SiON), silicon monoxide (SiO), silicon oxynitrocarbide (SiONC), silicon oxycarbide (SiOC), or other suitable low-k dielectric material. In some embodiments, the k value of the inner spacer 134, 174 materials is the same as the k value of the outer spacer 132, 172 material. In an example, the inner spacer 134, 174 also includes one or more air gap adjacent to one or more of the respective gate structure 130, 170 or the respective source/drain structure 140, 180.

In an embodiment, a base layer 190 is positioned within the substrate 102 and below one or more of the device 110 or the device 150. FIG. 1 shows, as an illustrative example, that the base layer 190 is positioned within the substrate region 104 and below the device 110, which does not limit the scope of the disclosure. In an embodiment, the base layer 190 includes a silicon germanium base layer 192 that is formed directly over the underlying substrate 102, e.g., the N-well 104. In some scenarios, a silicon base layer 194 is formed over the silicon germanium base layer 192, which are both parts of the base layer 190. In some embodiments, the base layer 190 may include multiple silicon germanium base layers and multiple silicon base layers vertically stacked in an alternating manner. In an embodiment, a surface 190S of the base layer 190 is substantially at a same level as a surface 102S of the substrate 102.

In an embodiment, the base layer 190 includes a bottom portion 190B and a sloped sidewall portion 190SW. An angle θ1 between the bottom portion 190B and the sloped sidewall portion 190SW is within a range between about 5 degree to about 89 degree. In an embodiment, the angle θ1 is within a range between about 45 degree to about 65 degree. In a further embodiment, in a case that the substrate 102 is crystalline silicon, the angle θ1 is substantially about 54.7 degree.

A thickness T1 of the silicon germanium base layer 192 ranges between about 2 nm to as large as a critical thickness of the silicon germanium material of the silicon germanium base layer 192. The critical thickness of a silicon germanium material depends on a germanium concentration of the silicon germanium material. Critical thickness of $Si_{1-x}Ge_x$ refers to a maximum thickness of $Si_{1-x}Ge_x$ that can be grown over Si before relaxation of the strain occurs through the formation of misfit dislocations. The critical thickness of $Si_{1-x}Ge_x$ depends strongly on the germanium content, i.e., the "x". Specifically, a higher germanium concentration leads to a lower critical thickness of the silicon germanium material. For example, in a case that the germanium concentration of the germanium base layer 190 is about 20%, the thickness T1 is within a range between about 2 nm to about 60 nm.

The nanowire strips 120 and the nanowire strips 160 are formed from stacks of epitaxy layers that are deposited separately in different epitaxy growth procedures. In an embodiment, the epitaxy layers for the nanowire strips 160 are deposited in a first region while the epitaxy layers for the nanowire strips 120 are deposited in a second region contained within the first region. Specifically, the epitaxy layers for the nanowire strips 120 is formed in a trench formed in the epitaxy layers for the nanowire strips 160. The deposition procedures are described herein in details. The nanowire strips 120 and the nanowire strips 160 may include different thickness. Because the sacrificial strips used in making one of the devices 110, 150 and the nanowire strips 120, 160 of the other one of the first device 110 or the second device 150 are not made from the same epitaxy layers, they do not necessarily align with one another. As such, an inner spacer 134, 174 of one of the devices 110, 150 may not laterally align with a nanowire strip 160, 120 of the other one of the devices 150, 110. Note again that the nanowire strips 120 and the nanowire strips 160 are formed from stacks of epitaxy layers that are deposited separately in different epitaxy procedures as described herein in more details.

FIG. 1 shows that the n-well 104 and the p-well 106 are formed adjacent to one another, which is not limiting. In other embodiments, the p-well 106 and the n-well 104 may be separated by one or more insulation bodies, e.g., shallow trench insulation ("STI"). FIG. 1 shows that a dual-tub process is used, i.e., both p-well 106 and n-well 104 are formed in the substrate 102. Other processes, like a p-well process in an n-type substrate or an n-well process in a p-type substrate are also possible and included in the disclosure. That is, it is possible that one of the substrate regions 104, 106 is in a doped local region and the other is in the doped substrate. It is also possible that both the substrate region 104 and the substrate region 106 are intrinsic or intrinsically doped, e.g., unintentionally doped.

Figure 2:
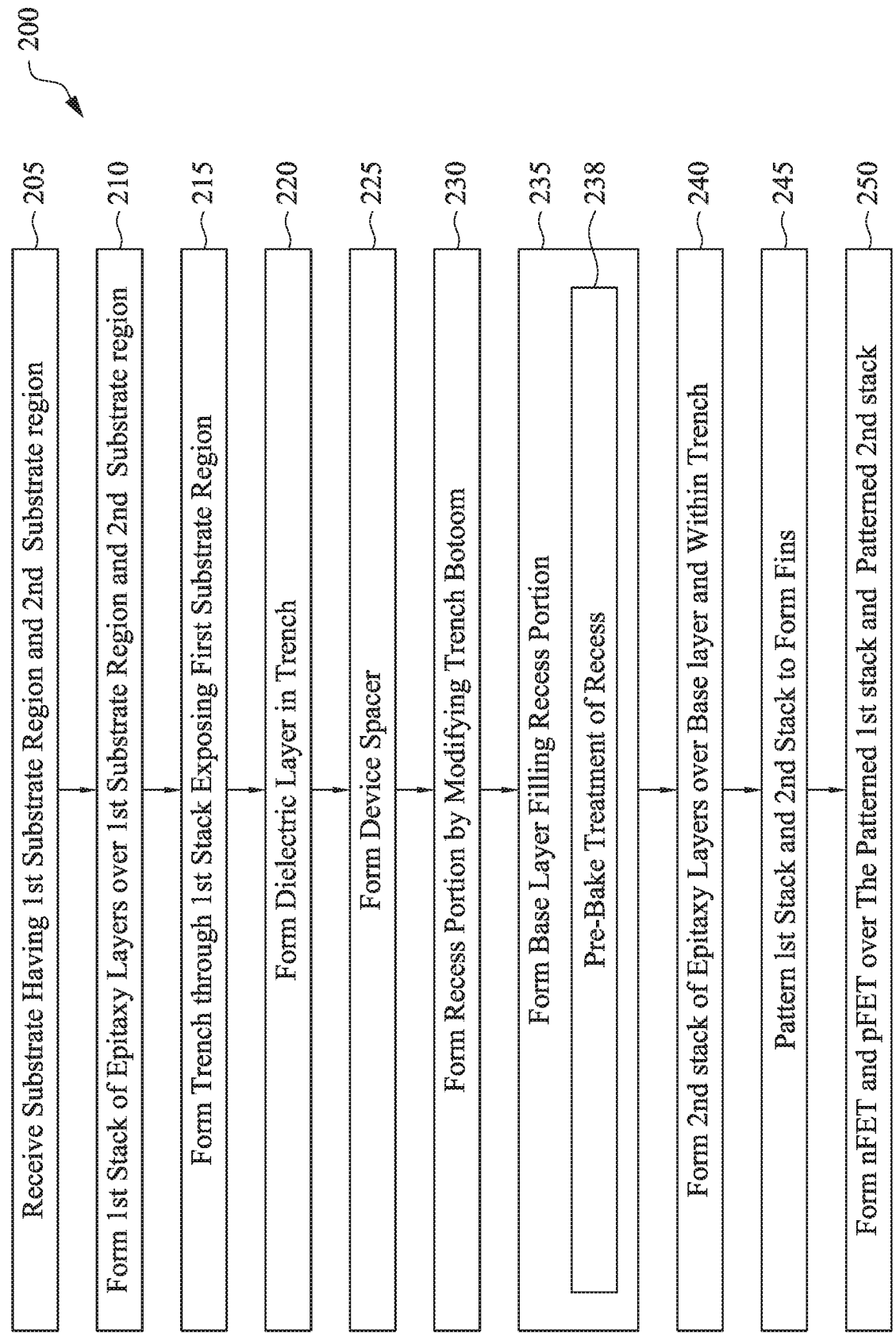
FIG. 2 is a flow diagram of an example process.

FIG. 2 shows an example process of making an IC device, e.g., the example IC 100 of FIG. 1. FIGS. 3A-3J show in cross-sectional views, different stages of a wafer 300 in the process of making the example IC 100 according the example process of FIG. 2.

Figure 3A:
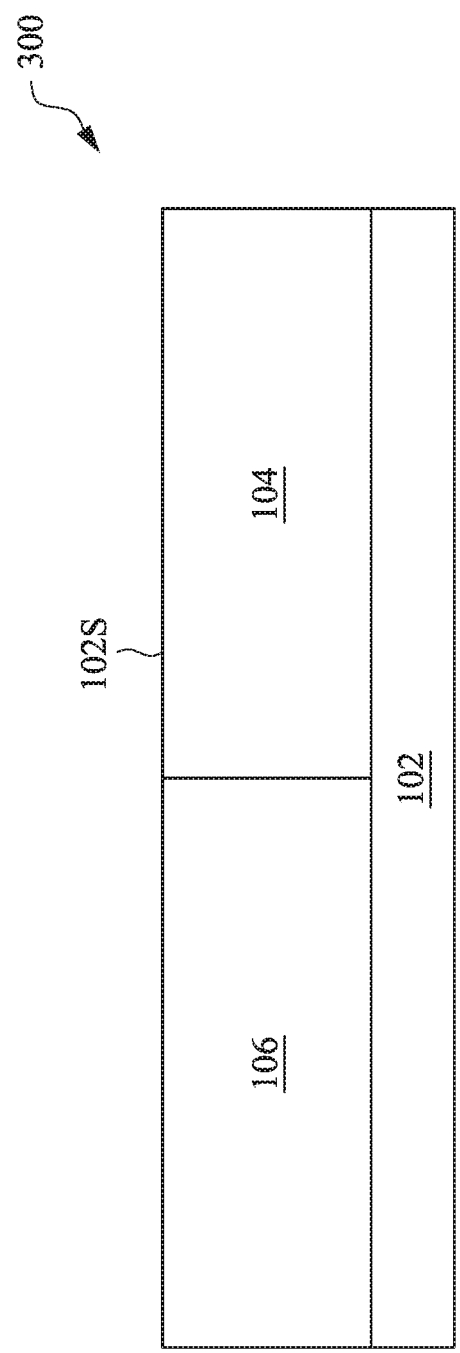
FIGS. 3A-3J are cross-sectional views of a wafer in various stages of an example process of making an IC having GAA devices.

In example operation 205, a wafer 300 is received. FIG. 3A shows that wafer 300 includes a substrate 102 that includes substrate region 104, e.g., an n-well, and a substrate region 106, e.g., a p-well, which are coplanar with one another at an upper surface 102S of the substrate 102. As an illustrative example, the substrate 102 is a silicon substrate in the crystalline facet of {100}. FIG. 3A shows, as a non-limiting illustrative example, that the substrate region 104 and the substrate region 106 interface with one another. The n-well 104 may be doped in various approaches with dopants or impurities of group V elements, like arsenic or phosphorous, or various combinations thereof. The p-well 106 may be doped in various approaches with dopants or impurities of group III elements, like boron or gallium, or various combinations thereof.

Figure 3B:
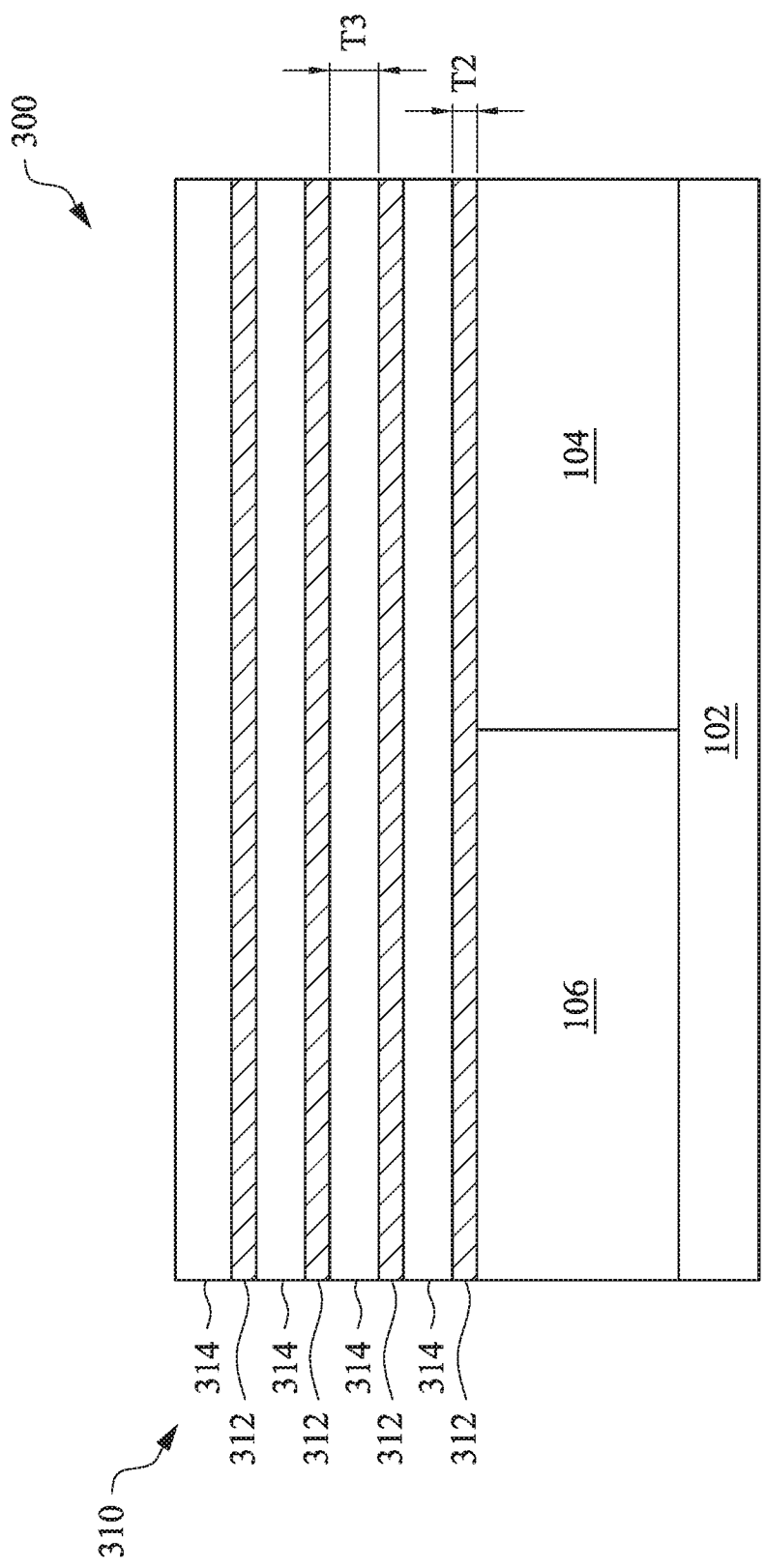

In example operation 210, with reference also to FIG. 3B, a first stack 310 of semiconductor epitaxy layers are formed globally on top of both the substrate region 104 and the substrate region 106. The term "globally" refers to that the first stack 310 are formed on both the substrate regions 104 and 106 as compared to "locally" to one of the substrate region 104 or the substrate region 106. The term "globally" as used herein does not necessarily mean that the first stack 310 is formed over the whole surface of the wafer. In an embodiment, the first stack 310 includes multiple epitaxy layers 312 (four layers shown as an illustrative example) of a first semiconductor material and multiple epitaxy layers layer 314 (four layers shown as an illustrative example) of a second semiconductor material. In an embodiment, layers 312 are silicon germanium and layers 314 are silicon.

In an embodiment, the silicon germanium epitaxy layers 312 each have a thickness T2 that is in a range about 2 nm to about 6 nm. The silicon epitaxy layers 314 each have a thickness T3 that is in a range about 4 nm to about 10 nm. In an embodiment, the thickness T3 of the silicon epitaxy layers 314 is larger than the thickness T2 of the silicon germanium epitaxy layers 312. In an embodiment, the thickness T3 of the silicon epitaxy layers 314 is about 8 nm and the thickness T2 of the silicon germanium epitaxy layers 312 is about 5 nm.

The epitaxy layers 312, 314 of the first stack 310 are formed using reduced pressure chemical vapor deposition ("RP-CVD"), plasma enhanced chemical vapor deposition ("PECVD"), atmospheric pressure CVD, inductively coupled PECVD, hot wire CVD, atomic layer deposition, molecular layer deposition or other suitable epitaxy approaches.

Figure 3C:
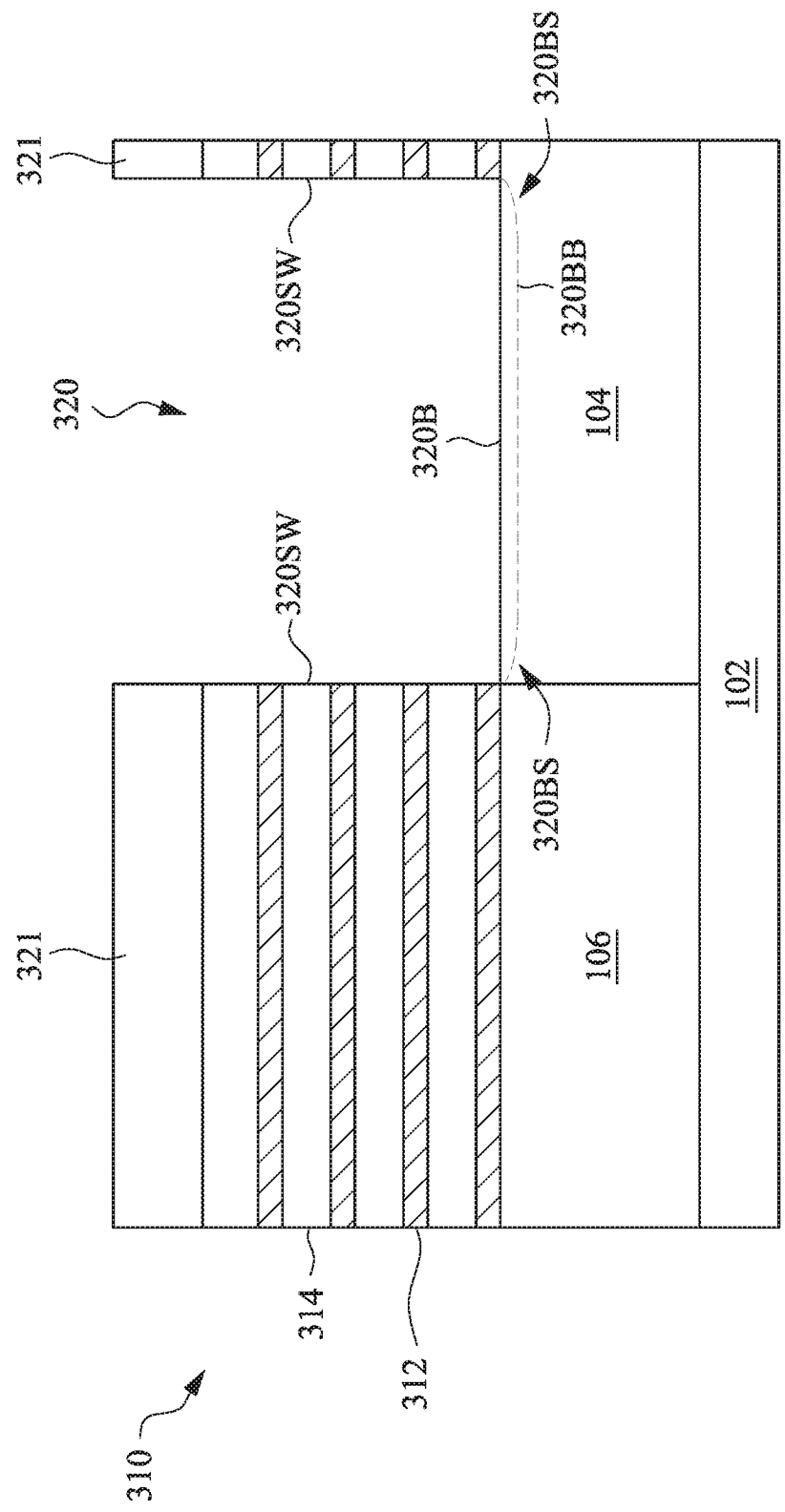

In example operation 215, with reference also to FIG. 3C, a trench 320 is formed through the first stack 310 over the first substrate region 104. For example, an oxide mask layer or a photoresist layer 321 is formed and patterned to expose the surface for forming the trench 320. The trench 320 exposes at least a portion of the first substrate portion 104. In an embodiment, the trench 320 is formed through a dry etching process, such as reactive-ion etching ("RIE") or other suitable dry etching processes. As the RIE is directional, the sidewalls 320SW of the trench 320 are relatively plumb. It is desired that the bottom 320B of the trench 320 is relatively flat. However, in actual production, the RIE may produce a bottom 320B that includes a relatively flat central bottom portion 320BB and sloped bottom sidewall portion 320BS. In FIG. 3C, the central bottom portion 320BB and the sloped bottom sidewall portion 320BS are illustrated using dotted lines.

Figure 3D:
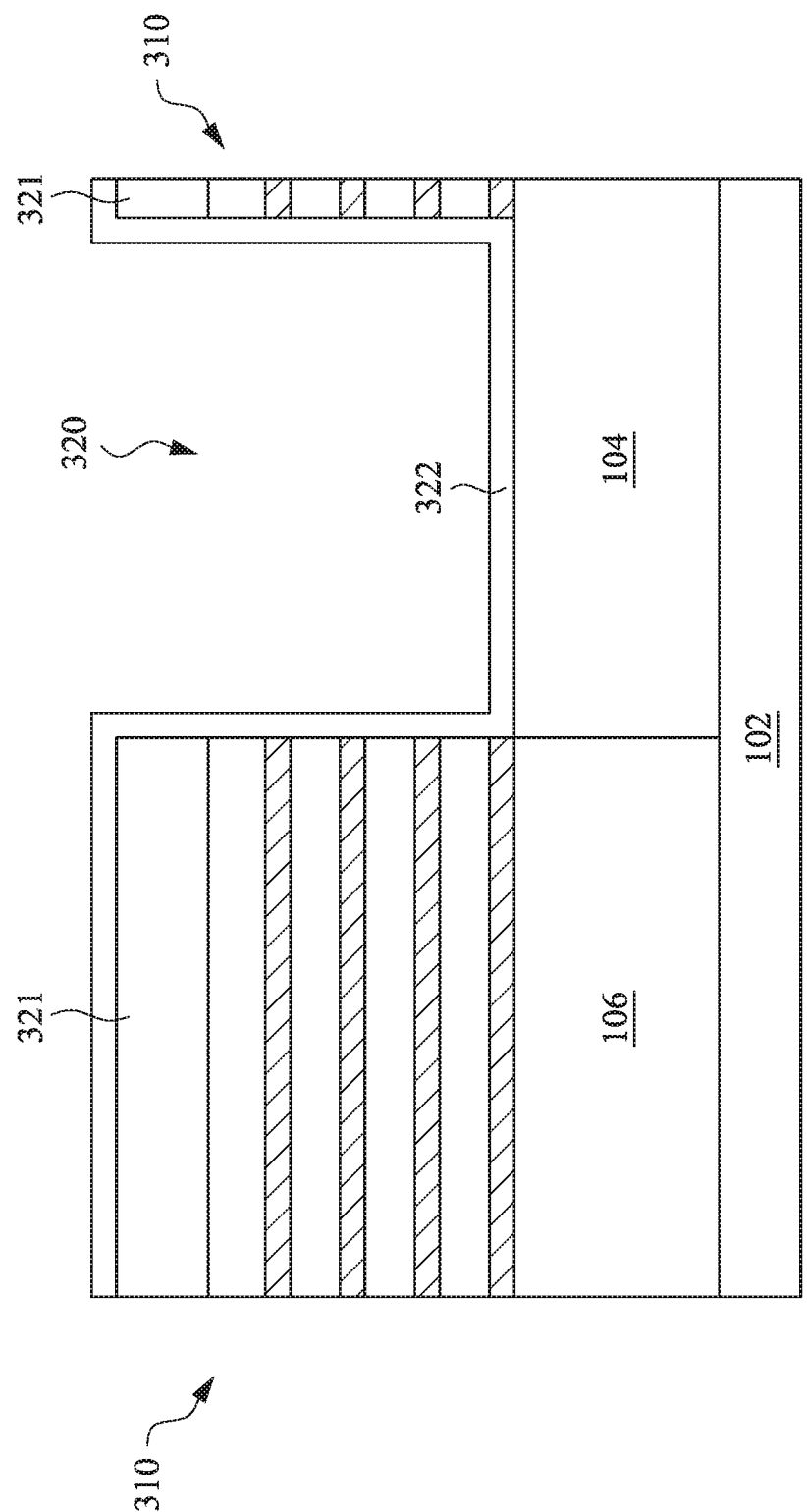

In example operation 220, with reference also to FIG. 3D, a conformal dielectric layer 322 is deposited over the wafer 300 including the first stack 310 and the trench 320. The dielectric layer 322 is oxide, nitride or other suitable dielectric material and is formed through CVD, ALD or other suitable deposition techniques. The deposition thickness of the dielectric layer 322 is about 5 nm to about 60 nm. It is also possible that the dielectric layer 322 is deposited within the trench 320 only and is not deposited over the first stack 310. In an embodiment, the mask layer 321 remains covering the first stack 310.

Figure 3E:
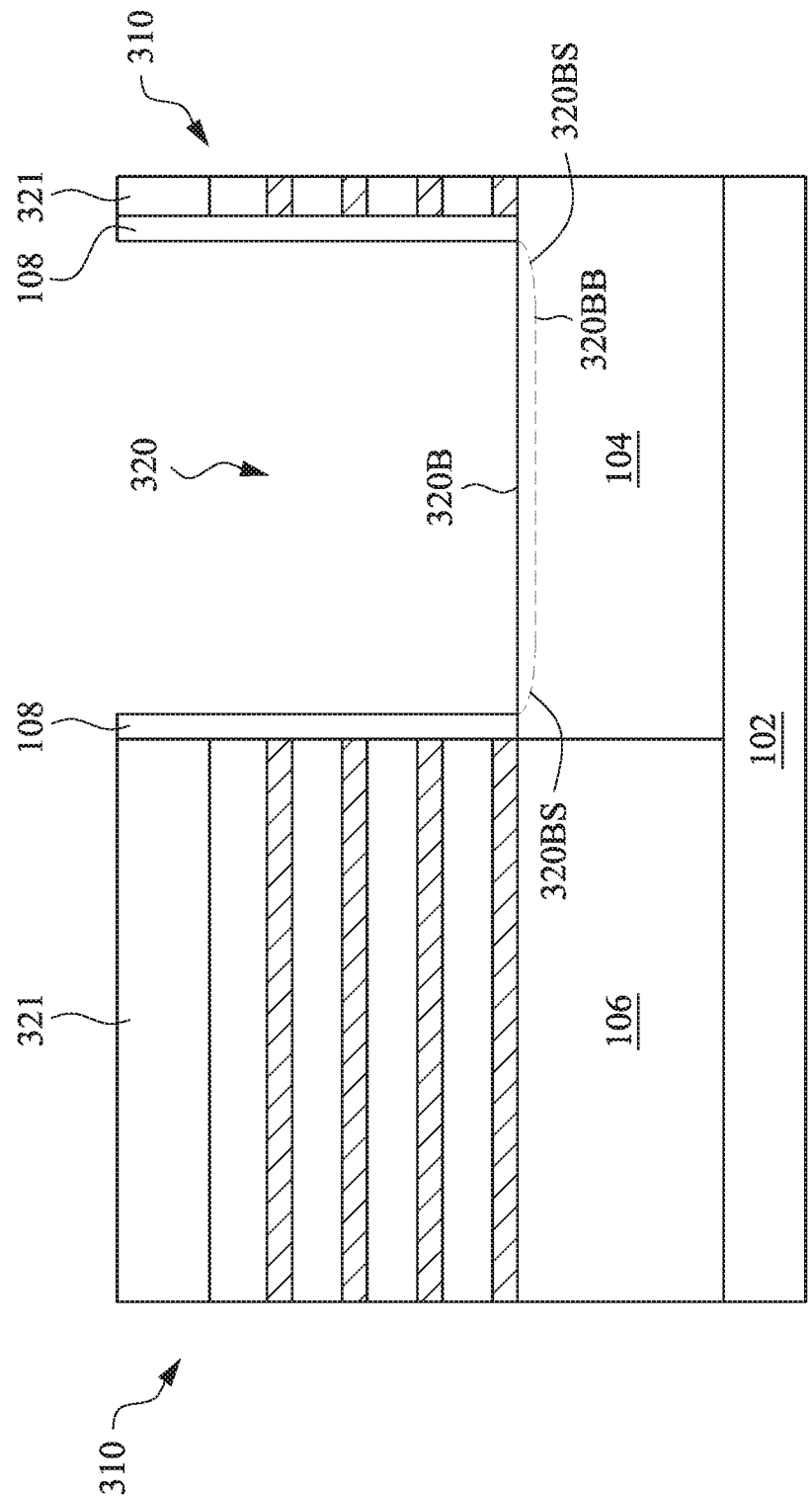

In example operation 225, with reference also to FIG. 3E, device spacer 108 is formed between the first stack 310 and the trench 320. Specifically, the device spacer 108 laterally separates the trench 320 from the first stack 310. The device spacer 108 is formed by patterning the dielectric layer 322. The dimension(s) of the device spacer 108 may change in the subsequent processes, e.g., after the mask layer 321 is removed later, which is appreciated in the field of semiconductor wafer fabrications.

With the device spacer 108 formed, the bottom 320B of the trench 320 may be further impacted by the etching and the bottom 320B may actually include a relatively flat bottom portion 320BB and a sloped bottom sidewall portion 320BS, shown in dotted line.

Figure 3F:
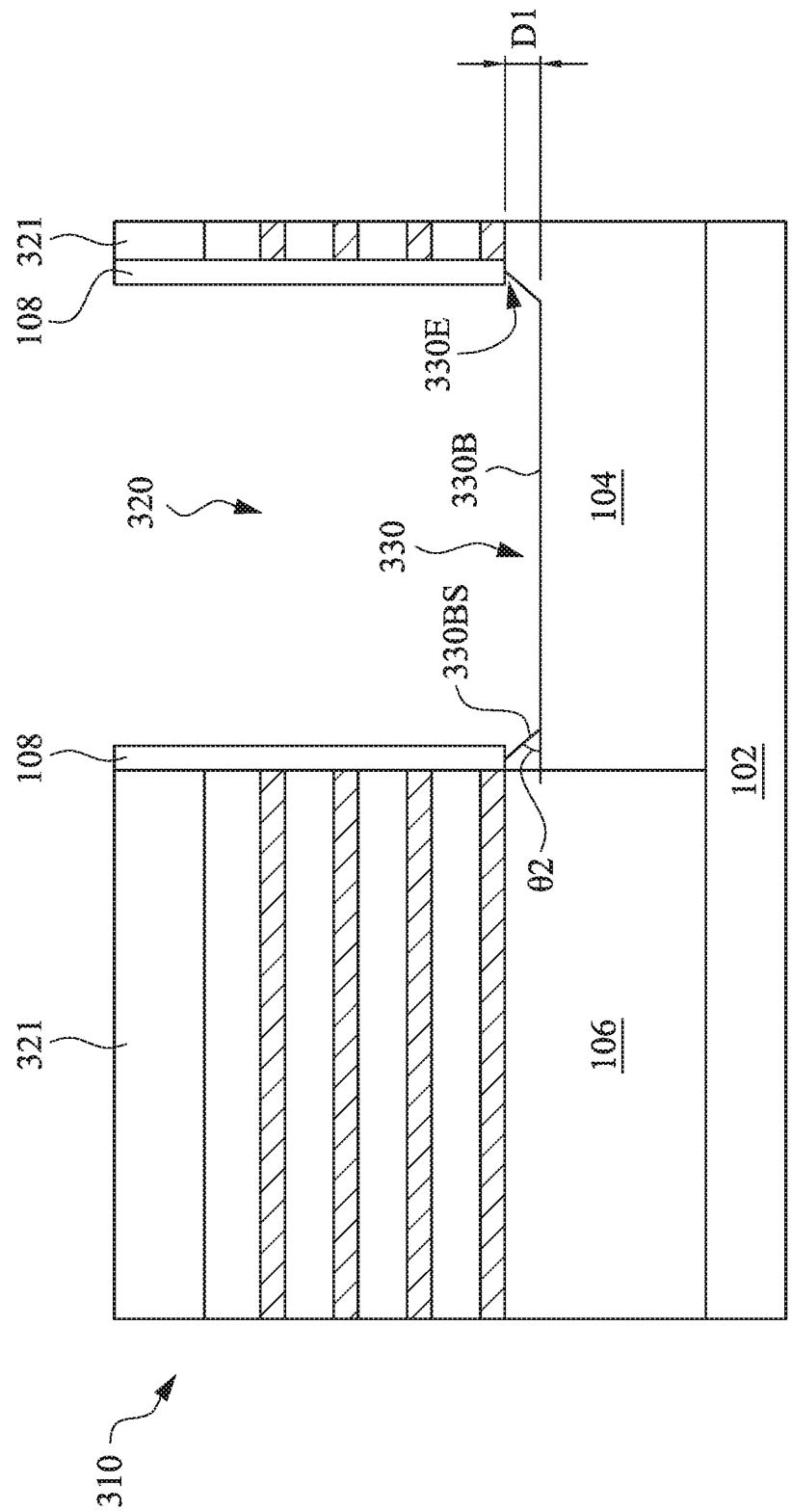

In example operation 230, with reference also to FIG. 3F, a recess portion 330 is formed by modifying the bottom 320B of the trench 320. In an embodiment, the modification is achieved through an anisotropic etching that has different etch rates for different crystalline facet orientations of the substrate 102 material. For example, in the case that the substrate 102 is silicon, one or more etchants of ammonia, HCl, KOH, TMAH or EDP may be used to implement the crystallographic anisotropic etching. For example, for ammonia, the relative etching rates among various silicon facets are {110}>{100}>>{110}. For HCl, the etching rate differences among {100}, {110}, {111} facets are 10:78:9. For KOH, the etching rate differences among {100}, {110}, {111} facets are 300:600:1. For TMAH, the etching rate differences among {100}, {110}, {111} facets are 37:68:1. For EDP, the etching rate differences among {100}, {110}, {111} facets are 20:10:1. With the suitable etchants applied in the etching process, a corresponding profile of the recess portion 330 is formed. For example, in an example that the substrate 102 is {100} facet of silicon, the KOH or TMAH etchants will form a recess portion 330 that has a relatively flat bottom portion 330B, and a sloped sidewall portion 330BS that is substantially in the {111} facet of silicon. This shape is achieved through the vast differences in the etching rate among {100}, {110} and {111} facets of silicon. For example, in an embodiment, an angle θ2 between the sidewall 330BS and the bottom 330B of the recess portion 330 is substantially about 54.7 degree, which is basically the angle between the {111} facet plane to the {100} facet plane of silicon.

With different etchants chosen and different etching conditions, e.g., etchant solution concentration, temperature, pressure, etc., the profiles or shapes of the recess portion 330 vary. For example, the angle θ2 may vary between about 5 degree to about 89 degree. This angle range is important to maintain that the sidewall 330BS is sloped and is not plumb/vertical, e.g., 90 degree. A depth D1 of the recess portion 330, e.g., from the bottom portion 330B to the surface of the substrate 102, may also vary from about 2 nm to about 80 nm. However, all those variations are controlled or controllable variation. As such, the resultant profile or shape of the recess portion 330, e.g., parameters of the angle θ2 and/or the depth D1, is relatively determined or known through simulation or experimental data. These known parameters of the resultant recess portion 330 enables techniques to fill the recess portion 330 in a proper way such that a surface of the filler layer or layers is relatively flat.

In an embodiment, because the anisotropic etching process is conducted after the device spacer 108 is formed, a portion of the substrate 102 below the device spacer 108 is removed by the etching process. Therefore, an undercut is formed and an edge 330E of the recess portion 330 extends below the device spacer 108.

Figure 3G:
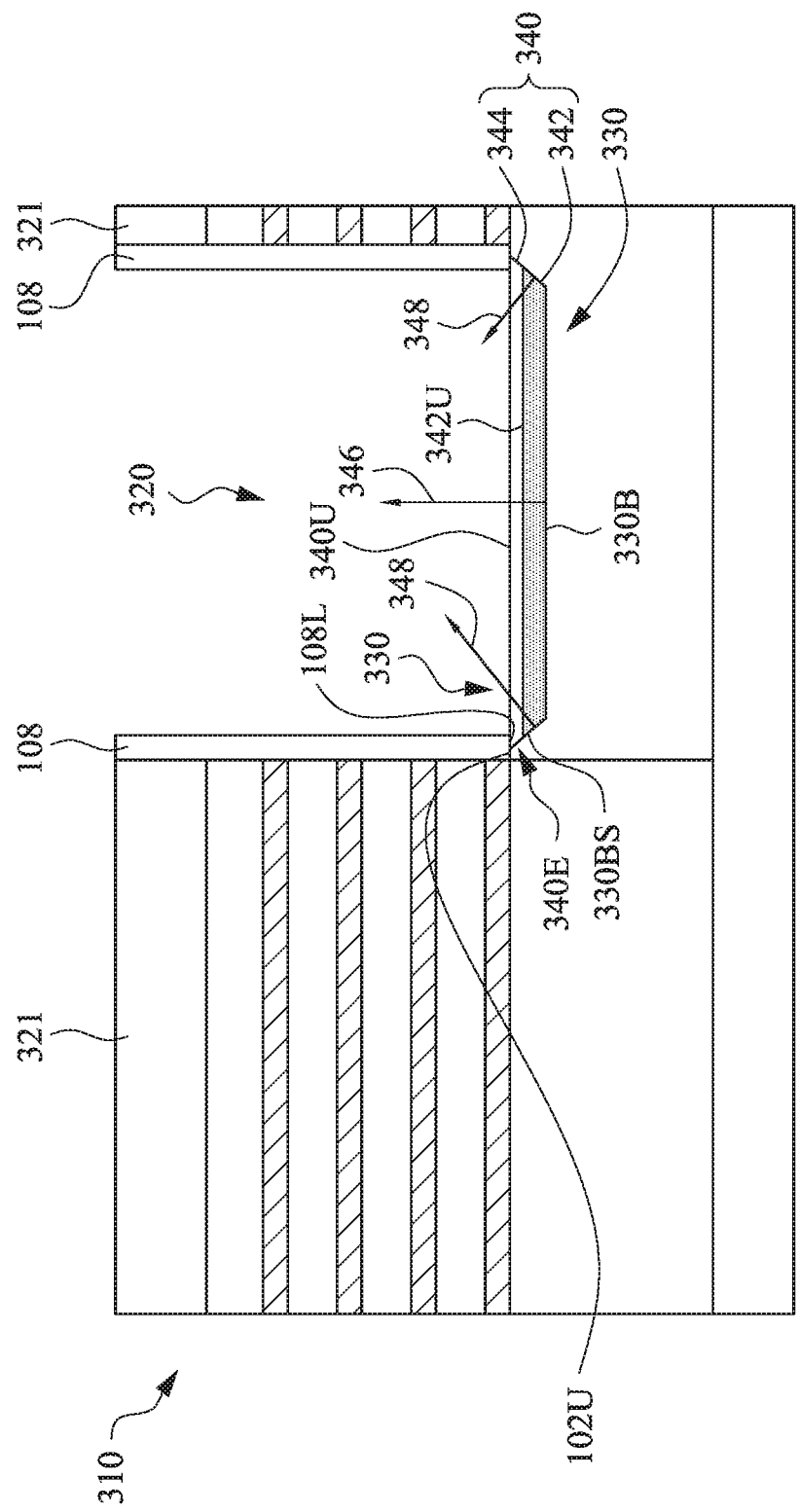

In example operation 235, with reference also to FIG. 3G, a semiconductor base layer 340 is formed within and filling the recess portion 330. In an embodiment, the semiconductor base layer includes a semiconductor base layer of a material that has gap filling properties. For example, silicon germanium is a suitable semiconductor material for the gap filling properties. In an embodiment, the semiconductor base layer 340 includes one or more silicon germanium layers 342, with one of the silicon germanium layer 342 directly on the underlying substrate 102. That is, minor gaps on the bottom 330B of the recess portion 330, if any, are filled by the silicon germanium layer 342, which are not translated to the upper surface 342U of the silicon germanium base layer 342.

In an embodiment, an epitaxy process is used in depositing the silicon germanium base layer 342. The epitaxy process is tuned in a way that the silicon germanium material grows faster along the facet orientation 346 of the bottom 330B than along the facet orientation 348 of the sidewall 330BS of the recess portion 330. As a result, the epitaxy growth along the facet orientation 348 is refrained and the silicon germanium base layer 342 is deposited substantially along the orientation 346 and has a relatively flat upper surface 342U. For example, in a case that the sloped sidewall 330B S is at the {111} facet plane of silicon and the bottom 330B is at the {100} facet plane of silicon, the silicon germanium epitaxy process is tuned to deposit {100} facet silicon germanium. Due to lattice mismatch, the grown silicon germanium of {100} facet does not stay on the sloped sidewall 330BS of {111} facet silicon. For example, the epitaxy process may include temperatures in a range between about 500° C. to about 650° C., a pressure range between about 10 Torr to 300 Torr. The precursors may be one or more of $SiH_2Cl_2$ ("dichlorosilane") and $GeH_4$ ("germane"), $SiH_4$, $Si_2H_6$ and $Ge_2H_6$, or other suitable precursors for silicon and germanium.

It should be appreciated that the silicon germanium base layer epitaxy process is tuned based on the known or determined parameters of the recess 330, e.g., the angle θ2 of the sidewall 330BS. When the angle θ2 is not exactly 54.7 degree, e.g., the {111} facet, the facet orientation 348 of the sidewall 330BS may include components of the {100} facet, the {110} facet and the {111} facet. The fine tuning of the epitaxy process determines a suitable set of epitaxy conditions to achieve the selective growth of the silicon germanium layer 342 along the facet orientation 346 instead of the facet orientation 348. Further, the example operation 235 and the example operation 230 may also be coordinated in a reversed way in that the angle θ2 of the sidewall 330BS is determined based on a fixed epitaxy process, e.g., with known silicon germanium deposition rates among different facet orientations. With that, a suitable crystallographic anisotropic etching process is selected to form the recess portion 330 with the determined angle θ2 suitable for the epitaxy process.

With this technique being applied, the bottom profile of the trench 320 is modified or determined. The parameters like the angle θ2 and the depth D1 are obtained through simulation or experiments. With such parameters provided, the epitaxy process of forming the silicon germanium base layer 342 is controllable to achieve a relatively flat upper surface 342U.

Further, with the depth D1 of the recess portion 330 provided, the deposition thickness of the silicon germanium epitaxy layer 342 is accurately designed and may be monitored in-situ during the epitaxy process through, e.g., oscillating quartz resonators. Such in-situ monitoring provides substantially real-time feedback to the thickness control in the thin film deposition component of the epitaxy process. Therefore, precise control of the thickness of the epitaxy layer 342 is enhanced by optimizing the epitaxy parameters dynamically during the deposition process through the real time monitoring and feedback approaches.

Additionally, the structural feature of the edge 330E extending below the device spacer 108 provides an aspect ratio change benchmark for the silicon germanium epitaxy layer 342. With the aspect ratio change benchmark, the epitaxy process is controlled such that the silicon germanium epitaxy layer 342 or any additional epitaxy layer of the base layer 340 stop at the edge 330E or at the lower surface 108L of the device spacer 108. As a result, an upper surface 340U is substantially at a same level as the upper surface 102U of the substrate 102 where the device spacer 108 seats on. Further, an edge portion 340E of the base layer 340 extends below the lower surface 108L of the device spacer 108.

In an embodiment, depending on the material of the epitaxy layers that is formed over the semiconductor base layer 340, another base layer 344 may be formed over the silicon germanium base layer 342. For example, a silicon base layer 344 may be formed over the silicon germanium base layer 342. Similar controls of epitaxy growth on the facet direction 348 of the sidewall 330BS and on the facet direction 346 of the bottom 330B are applied to the deposition of the silicon base layer 344. As a result, the upper surface of the silicon base layer 344 is relatively flat.

FIG. 3G shows, as an illustrative example, that the semiconductor base layer 340 includes two layers 342 and 344 of silicon germanium and silicon, respectively. This specific example does not limit the scope of the disclosure. The base layer 340 may include other semiconductor materials suitable for selective epitaxy growth along different facet directions. Further, the semiconductor base layer 340 may include more than two layers of different base layers depending on the depth D1 of the recess portion 330, the critical thickness of a base layer, and the materials of the epitaxy layer directly grown on the upper surface 340U of the base layer 340. For example, a silicon germanium base layer 342 should be thinner than the critical thickness thereof to maintain structural integrity. The critical thickness of a silicon germanium layer depends on a germanium concentration thereof. For example, in a case that the germanium concentration is about 20%, the critical thickness is about 60 nm.

In an embodiment, the forming the base layer 340 includes a pre-baking process 238, which heats the recess portion 330 before the epitaxy process of the base layer 340. The pre-baking process removes the native oxide on the bottom of the recess portion 330. In an embodiment, the pre-baking process is conducted with a surface temperature of 800-950° C., a surface pressure of 100 Torr-300 Torr and with a flow of hydrogen for about 10-100 seconds.

Figure 3H:
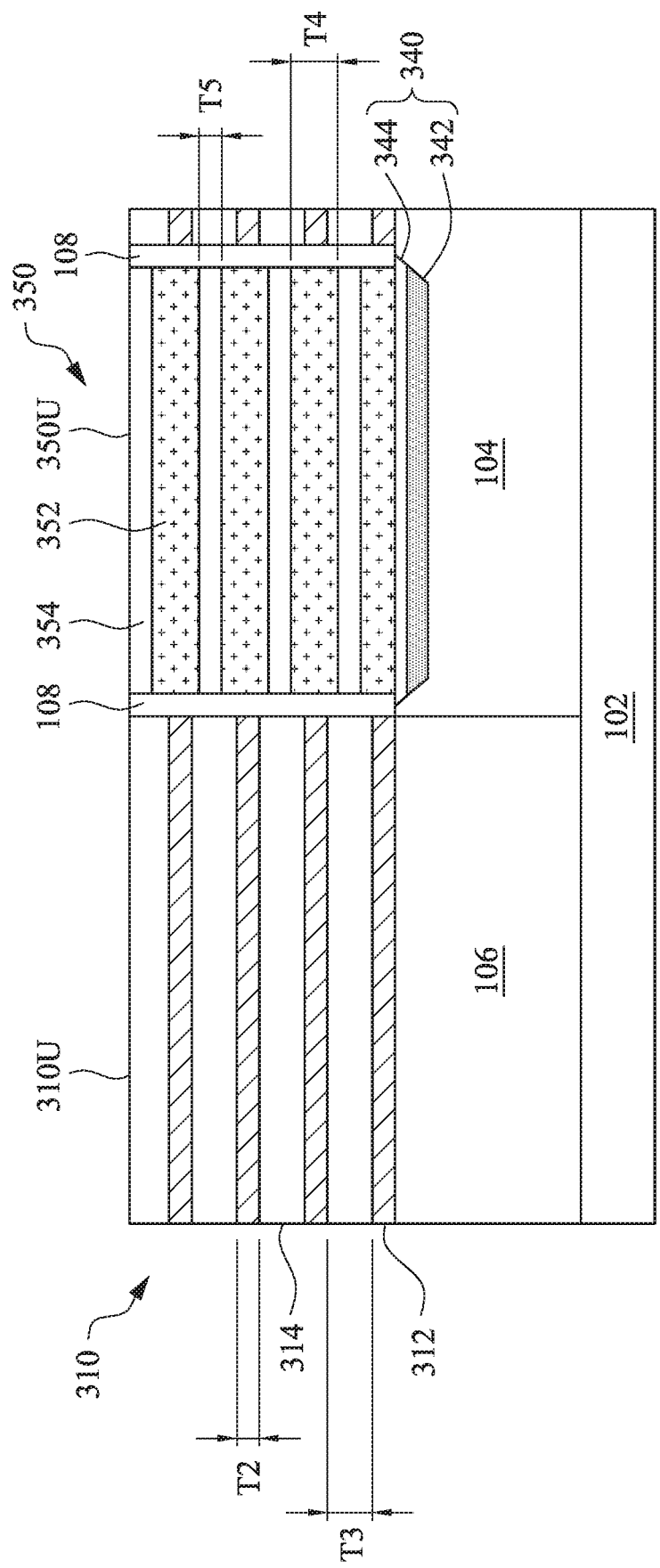

In example operation 240, with reference also to FIG. 3H, a second stack 350 of epitaxy layers 352, 354 are formed over the base layer 340 and within the trench 320. The second stack 350 includes silicon germanium epitaxy layers 352 and silicon epitaxy layers 354 stacked vertically in an alternating manner. In an embodiment, a thickness T4 of the silicon germanium layer 352 in the second stack 350 is different from the thickness T2 of the silicon germanium layer 312 in the first stack 310. A thickness T5 of the silicon layer 354 in the second stack 350 is different from the thickness T3 of the silicon layer 314 in the first stack 310. Further, the thickness T4 of the silicon germanium layer 352 is different from the thickness T5 of the silicon layer 354 in the second stack 350.

Further, as the silicon germanium layers 352 in the second stack 350 are formed separately from the silicon germanium layer 312 of the first stack 310, the silicon germanium layers 352 may include a different germanium concentration than the silicon germanium layer 312.

As shown in FIG. 3H, after the second stack 350 is formed. The mask layer 321 (FIG. 3G) may be removed through, e.g., etching or planarization, and the device spacer 108 may be truncated to reduce the vertical dimension through the planarization process.

In an embodiment, the thickness T2, T3, T4, T5 are individually designed for the first stack 310 and the second stack 350. Factors may include whether the respective epitaxy layers 312, 314, 352, 354 are used to form channel nanowire strips or as sacrificial nanowire strips. Factors may also include the respective types of devices to be formed therefrom. The first stack 310 and the second stack 350 are separately formed to make different types of devices, e.g., nFET and pFET devices. Using the disclosed techniques, the first stack 310 and the second stack 350 are separately formed and the thickness T2, T3, T4, T5 of the epitaxy layers 312, 314, 352, 354 are separately controlled to meet the individual device designs or operation designs for the respective devices, e.g., nFET and pFET.

In an embodiment, to facilitate the subsequent fabrication processes, the upper surface 310U and 350U of the first stack 310, the second stack 350, respectively, are substantially at a same level. The thickness T4 of the silicon germanium layer 352 of the second stack 350 is substantially the same as the thickness T3 of the silicon layer 314 of the first stack 310, here, e.g., 8 nm. The thickness T5 of the silicon layer 354 of the second stack 350 is substantially the same as the thickness T2 of the silicon germanium layer 312 of the first stack 310, here, e.g., 5 nm.

FIG. 3H shows that the first stack 310 and the second stack 350 include a same sequential order among the respective silicon germanium epitaxy layers 312, 352 and the silicon epitaxy layers 314, 354. That is, the stacks 310, 350 both start with a silicon germanium epitaxy layers 312, 352 at the bottom and end with a silicon epitaxy layers 314, 354 at the top. This illustrative example does not limit the scope of the disclosure. One or more of the first stack 310 or the second stack 350 may start with a silicon epitaxy layer at the bottom, which is also possible and included in the disclosure.

FIG. 3H shows, as an illustrative example, that the second stack 350 and the first stack 310 both include silicon and silicon germanium epitaxy layers. This example does not limit the scope of the disclosure. In other examples, the second stack 350 may include other material combinations for the epitaxy layers from that of the first stack 310.

In a GAA process, the silicon epitaxy layers 314 of the first stack 310 are used to make nanowire channel regions of nFET devices and the silicon germanium epitaxy layers 312 of the first stack 310 are used to make sacrificial nanowire strips, e.g., to be removed later. The silicon germanium epitaxy layers 352 of the second stack 350 are used to make nanowire channel regions of pFET devices and the silicon epitaxy layers 354 of the second stack 350 are used to make sacrificial nanowire strips.

Figure 3I:
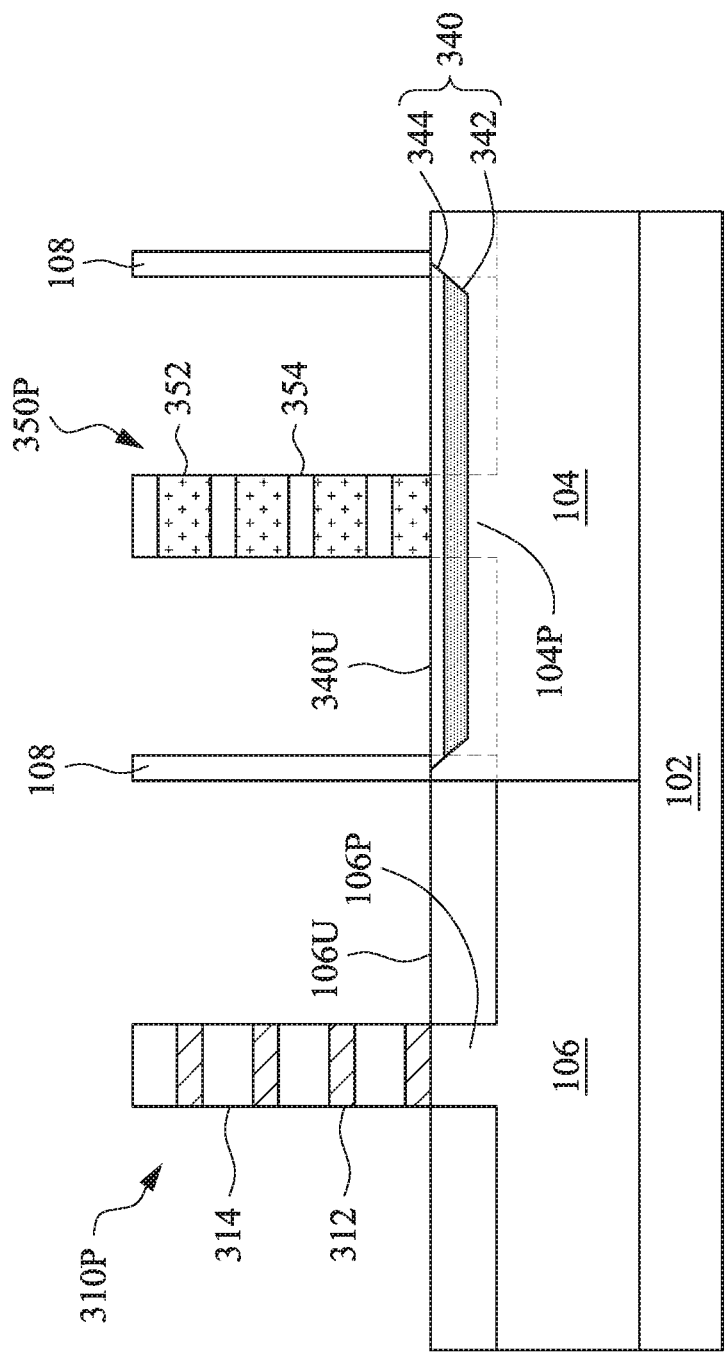

In example operation 245, with reference also to FIG. 3I, the first stack 310 and the second stack 350 are patterned to form a first patterned stack 310P of silicon germanium nanowire strips 312 and silicon nanowire strips 314 and a second patterned stack 350P of silicon germanium nanowire strips 352 and silicon nanowire strips 354. In some embodiment, the first patterned stack 310P and the second patterned stack 350P are fin-shaped.

In some embodiments, the patterning may also form fin-shaped substrate portions 106P, 104P (both shown in dotted lines) below the fin-shaped first patterned stack 310P and the second patterned stack 350P, respectively. Dielectric layers may be formed surrounding the fin-shaped substrate portion 106P, 104P up to the level of the upper surface 106U, 340U of the second substrate region 106, the base layer 340, respectively. The fin-shaped substrate portion 104P includes a patterned portion 196 (FIG. 1) of the base layer 340.

Figure 3J:
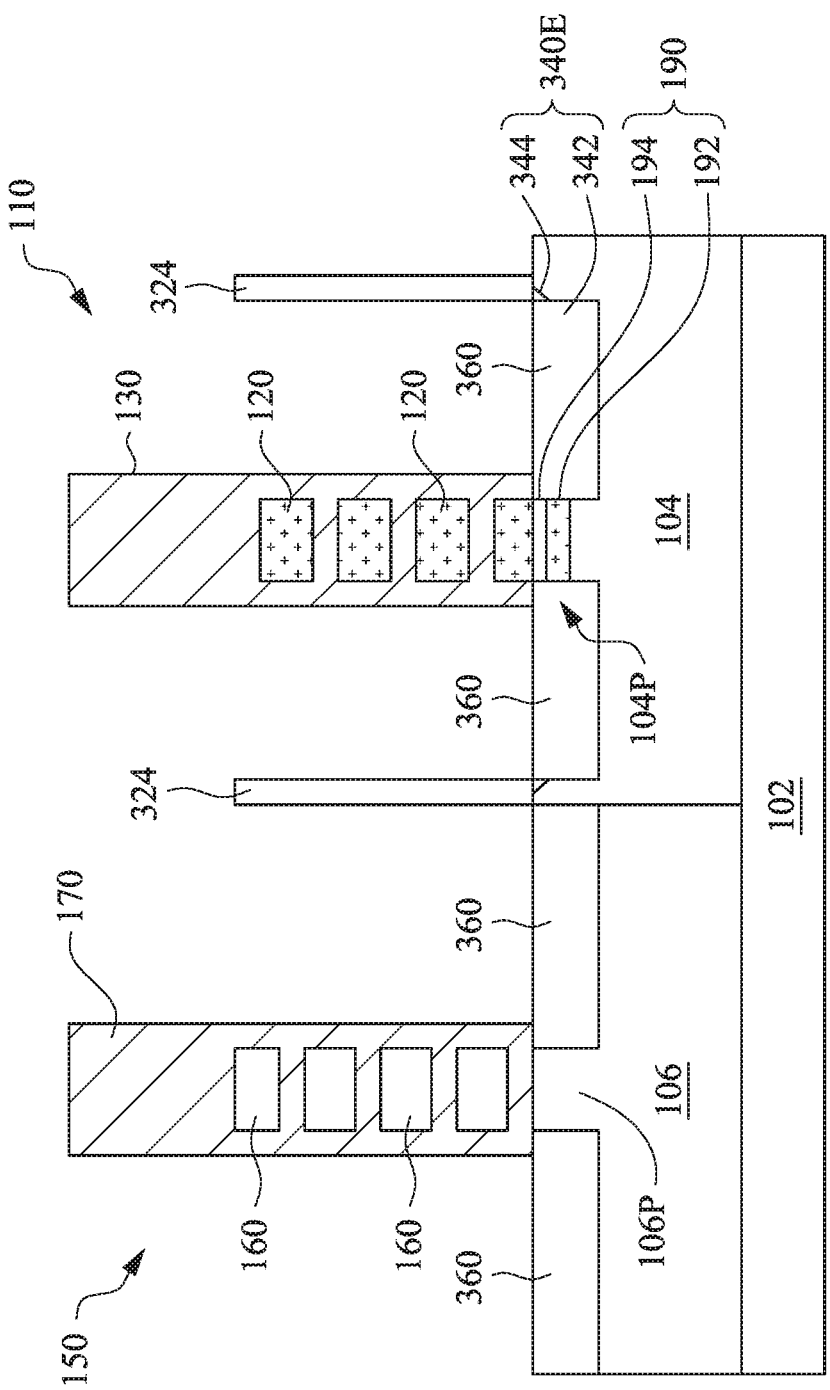

In example operation 250, with reference also to FIG. 3J, an nFET device 150 and a pFET device 110 are formed over the first patterned stack 310P and the second patterned stack 350P, respectively, using a gate-all-around ("GAA") process. For example, the channels 160 of the nFET device 150 are made from the silicon nanowire strips 314, and the channels 120 of the pFET device 110 are made from the silicon germanium nanowire strips 352. The sacrificial nanowire strips 312 of silicon germanium is removed and replaced with the gate structure 170 of the nFET device 150. The sacrificial nanowire strips 354 of silicon is removed and replaced with the gate structure 130 of the pFET device 110.

The base silicon germanium layer 192 (patterned from base layer 342) and the base silicon layer 194 (patterned from base layer 344) are part of the patterned substrate 104P below the pFET device 110. The base silicon germanium layer 192 and the base silicon layer 194 are not used to make the channel region 120 because their deposition are tailored for filling the recess portion 330 and are not tailored for the channels region(s).

Because the edge portion 340E of the base layer 340 extend below the device spacer 108, at least part of the edge portion 340E will remain after patterning the substrate 104 and forming the fin-shaped substrate pattern 104P. In an embodiment, the remaining edge portions 340E are adjacent to the device spacer 108 on the top and the dielectric layer 360 by the side. The remaining edge portions 340E are part of the base layer 190, which are both patterned from the same base layer 340.

As appreciated, FIG. 3J shows the devices 110, 150 from a different view from that of FIG. 1. Either one or both of FIGS. 1 and 3J are not meant to limit the scope of the disclosure with respect to the relative positions and/or connection arrangements between the nFET device 150 and the pFET device 110 in a complementary manner in an integrated circuit.

As described herein, the sequential orders, the materials, and the thickness or other parameters of the nanowire strips 312, 314, 352, 354 in the separately formed nanowire stack 310, 350 could be customized and optimized separately for each devices 150, 110. Such flexibility is advantageous in improving the device performance of pFET and nFET devices separately and individually. Further, the device spacer 108 is integrated in the formation of the nanowire stacks 310, 350, which simplifies the integration of the CMOS process into a high voltage analog process like a bipolar-CMOS-DMOS "BCD" process.

Further, the disclosed technique of forming the base layer 340 resolves the problems of epitaxy growth in a sloped bottom portion of a trench. The controlled facet angles of the recess portion 330 and the controlled epitaxy growth of the base layers in the base layer 340 achieve a relatively flat upper surface of the base layer 340. Such a base layer 340 facilitates epitaxy growth of semiconductor layers thereover.

In an alternative or additional embodiment to FIG. 3C, a hard mask layer stays over the first stack 310 after the trench 320 is formed. For example, the hard mask layer may be is patterned as an etch stop layer in etching the trench 320. After the trench 320 is formed through etching, the hard mask layer is not removed or is not lately removed. The remaining hard mask layer may function as an additional etch stop layer or CMP stop layer in a subsequent process that includes an etching components or a subsequent CMP process. For example, a subsequent epitaxy process may include an etching component. The hard mask layer is one or more of silicon oxide, aluminum hafnium oxide, magnesium aluminum oxide, silicon nitride or other suitable etch stop materials.

The hard mask layer functions as an etch stop or CMP stop layer in removing the excess dielectric layer 322 that is deposited over the first stack 310.

The hard mask layer may remain until the second stack 350 is formed within the trench 320, e.g., through processes similar to those shown in FIGS. 3F to 3H. After the second stack 350 has been formed, the hard mask layer may be removed, e.g., through a polishing process, and the structure of FIG. 3H may be obtained.

The present disclosure may be further appreciated with the description of the following embodiments:

In an embodiment, an integrated circuit includes a substrate that includes a first substrate region and a second substrate region. The integrated circuit also includes a first device over the first substrate region and a second device over the second substrate region. The first device includes a first plurality of nanowire strips of a first semiconductor material, a first gate structure surrounding at least one of the first plurality of nanowire strips, and a first source/drain structure contacting the at least one of the first plurality of nanowire strips. The second device includes a second plurality of nanowire strips of a second semiconductor material over the second substrate region, a second gate structure surrounding at least one of the second plurality of nanowire strips, and a second source/drain structure contacting the at least one of the second plurality of nanowire strips. The integrated circuit also includes a semiconductor base layer embedded in one of the first substrate region or the second substrate region and under a corresponding one of the first device or the second device.

In a structure embodiment, a structure includes a substrate, a base layer embedded in a recess portion in the substrate, a device over the semiconductor base region. The base region includes a different material from the substrate. The device includes a plurality of nanowire strips of a semiconductor material, a gate structure surrounding at least one of the plurality of nanowire strips, and a source/drain structure contacting the at least one of the plurality of nanowire strips.

In a method embodiment, a first stack of a first plurality of semiconductor layers is formed over a crystalline substrate. A trench is formed within the first stack to expose the crystalline substrate through the trench. A device spacer is formed adjacent to a sidewall of the trench. A recess portion is formed at a bottom of the trench through an etching process that is anisotropic among crystalline facets of the crystalline substrate such that the recess has a bottom portion and a sloped sidewall portion that has an angle to the bottom portion. A semiconductor base layer is formed within the recess portion. A second stack of a second plurality of semiconductor layers is formed over the semiconductor base layer.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
forming a first stack of a first plurality of semiconductor layers over a crystalline substrate;
forming a trench within the first stack to expose the crystalline substrate;
forming a device spacer adjacent to a sidewall of the trench;
forming a recess portion at a bottom of the trench through an etching process that is anisotropic among crystalline facets of the crystalline substrate, the recess portion having a bottom portion and a sloped sidewall portion that has an angle to the bottom portion;
forming a semiconductor base layer within the recess portion; and
forming a second stack of a second plurality of semiconductor layers over the semiconductor base layer.

2. The method of claim 1, wherein the forming the semiconductor base layer includes a pre-baking process.

3. The method of claim 1, wherein the angle between the sloped sidewall portion to the bottom portion is between 5 degree and 89 degree.

4. The method of claim 3, wherein the crystalline substrate is silicon and the angle is within a range between 45 degree to 65 degree.

5. The method of claim 1, wherein an epitaxy process is used in the forming the semiconductor base layer, the epitaxy process forming an epitaxial material of the semiconductor base layer slower along a facet orientation of the sloped sidewall portion than along a facet orientation of the bottom portion.

6. The method of claim 1, wherein the first stack includes a first silicon germanium layer and the second stack includes a second silicon germanium layer, the second silicon germanium layer includes a different germanium concentration than the first silicon germanium layer.

7. The method of claim 1, wherein the first stack includes a first silicon layer and the second stack includes a second silicon layer, the second silicon layer includes a different thickness from the first silicon layer.

8. A method of forming a semiconductor device, the method comprising:
forming a first stack of alternating layers of a first semiconductor material and a second semiconductor material over a crystalline substrate;
forming a trench within the first stack, wherein a surface of the crystalline substrate is exposed in the trench;
recessing a bottom of the trench to form a recess in the crystalline substrate, wherein the recess has sloped sidewalls along a first crystal plane of the crystalline substrate and a bottom surface along a second crystal plane of the crystalline substrate;
filling the recess with a base semiconductor layer;
forming a second stack of alternating layers of a third semiconductor material and a fourth semiconductor material;
removing the alternating layers of the fourth semiconductor material; and
forming a gate structure over the alternating layers of the third semiconductor material.

9. The method of claim 8 further comprising:
prior to recessing the bottom of the trench, forming a spacer along sidewalls of the trench.

10. The method of claim 9, wherein the recess extends under the spacer.

11. The method of claim 8, wherein the third semiconductor material and the first semiconductor material are silicon germanium.

12. The method of claim 11, wherein the third semiconductor material and the first semiconductor material have different germanium concentrations.

13. The method of claim 12, wherein the second semiconductor material and the fourth semiconductor material are silicon.

14. The method of claim 8, wherein forming the base semiconductor layer comprises:
forming a base silicon germanium layer on the crystalline substrate; and
forming a base silicon layer over the base silicon germanium layer, wherein the second stack of alternating layers is formed on the base silicon layer.

15. The method of claim 8, wherein filling the recess comprises an epitaxial growth process in which a growth rate along the sloped sidewalls of the recess is less than a growth rate along a bottom of the recess.

16. A method of forming a semiconductor device, the method comprising:
forming a first stack of alternating layers of a first semiconductor material and a second semiconductor material over a crystalline substrate;
forming a trench within the first stack, wherein a surface of the crystalline substrate is exposed in the trench;
forming a dielectric layer along sidewalls and a bottom of the trench;
removing the dielectric layer along the bottom of the trench to form a spacer along a sidewall of the trench and to expose the crystalline substrate in the trench;
etching the crystalline substrate to form a recess, wherein the recess has sloped sidewalls along a first crystal plane of the crystalline substrate and a bottom surface along a second crystal plane of the crystalline substrate;
epitaxially growing a base semiconductor layer in the recess;
forming a second stack of alternating layers of a third semiconductor material and a fourth semiconductor material over the base semiconductor layer;
removing portions of one of the alternating layers of the third semiconductor material and the alternating layers of the fourth semiconductor material; and
forming a gate structure over remaining portions of the second stack of alternating layers.

17. The method of claim 16, wherein epitaxially growing the base semiconductor layer comprises:
epitaxially growing a first base layer; and
epitaxially growing a second base layer over the first base layer.

18. The method of claim 17, wherein the first base layer and the third semiconductor layer comprise a same type of first material, and wherein the second base layer and the fourth semiconductor layer comprise a same type of second material.

19. The method of claim 18, wherein the same type of first material comprises silicon germanium, wherein a thickness of the first base layer is less than a critical thickness of the silicon germanium of the first base layer.

20. The method of claim 18, wherein etching the crystalline substrate to form the recess comprises exposing a lower surface of the spacer.

* * * * *